(12) United States Patent
Pan

(10) Patent No.: US 7,372,320 B2
(45) Date of Patent: May 13, 2008

(54) VOLTAGE REGULATION WITH ACTIVE SUPPLEMENTAL CURRENT FOR OUTPUT STABILIZATION

(75) Inventor: Feng Pan, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 81 days.

(21) Appl. No.: 11/303,569

(22) Filed: Dec. 16, 2005

(65) Prior Publication Data

US 2007/0139100 A1 Jun. 21, 2007

(51) Int. Cl.
*G05F 1/46* (2006.01)

(52) U.S. Cl. .................. 327/541; 327/543; 365/226

(58) Field of Classification Search ............... None
See application file for complete search history.

(56) References Cited

U.S. PATENT DOCUMENTS

| | | | |
|---|---|---|---|
| 5,029,282 A | 7/1991 | Ito | |
| 5,053,640 A | 10/1991 | Yum | |
| 5,373,477 A * | 12/1994 | Sugibayashi | ............... 365/226 |
| 5,596,532 A | 1/1997 | Cernea et al. | |
| 5,625,544 A | 4/1997 | Kowshik et al. | |
| 5,631,547 A * | 5/1997 | Fujioka et al. | ............... 323/273 |
| 5,796,296 A * | 8/1998 | Krzentz | ............... 327/545 |
| 5,883,501 A | 3/1999 | Arakawa | |
| 5,946,258 A | 8/1999 | Everett et al. | |
| 5,978,283 A | 11/1999 | Hsu et al. | |
| 6,091,282 A | 7/2000 | Kim | |
| 6,259,612 B1 | 7/2001 | Itoh | |
| 6,297,687 B1 | 10/2001 | Sugimura | |
| 6,320,797 B1 | 11/2001 | Liu | |
| 6,404,274 B1 | 6/2002 | Hosono et al. | |
| 6,424,570 B1 | 7/2002 | Le et al. | |
| 6,434,044 B1 | 8/2002 | Gongwer et al. | |
| 6,456,155 B2 * | 9/2002 | Takai | ............... 327/541 |
| 6,459,328 B1 | 10/2002 | Sato | |
| 6,529,437 B2 * | 3/2003 | Kono | ............... 365/226 |

(Continued)

FOREIGN PATENT DOCUMENTS

WO WO 99/49576 9/1999

OTHER PUBLICATIONS

Office Action dated May 2, 2007 received in related application, U.S. Appl. No. 11/303,387 (SDK1P028).

(Continued)

*Primary Examiner*—N. Drew Richards
*Assistant Examiner*—Terry L Englund
(74) *Attorney, Agent, or Firm*—Beyer Law Group LLP

(57) ABSTRACT

Techniques for efficiently stabilizing an output voltage produced by a voltage regulation circuit are disclosed. One embodiment pertains to a voltage regulation circuit that includes a supplemental current source that can be controllably activated to provide a supplemental current to an output terminal of the voltage regulation circuit. This supplemental current can then assist in stabilizing the output voltage level at the output terminal of the voltage regulation circuit even in the presence of high current surges by a load (i.e., electronic circuitry). Advantageously, given the availability of the supplemental current, the required amount of capacitance for a decoupling capacitor (also coupled to the output terminal of the voltage regulation circuit) can be significantly reduced. In the case of semiconductor electronic devices, the reduction in the needed capacitance yields substantial die area savings with respect to decoupling capacitors.

30 Claims, 4 Drawing Sheets

U.S. PATENT DOCUMENTS

| | | |
|---|---|---|
| 6,549,064 B2 | 4/2003 | Bandy et al. |
| 6,577,535 B2 | 6/2003 | Pasternak |
| 6,605,986 B2 | 8/2003 | Tanzawa et al. |
| 6,661,682 B2 | 12/2003 | Kim et al. |
| 6,760,262 B2 | 7/2004 | Haeberli et al. |
| 6,841,981 B2 | 1/2005 | Smith et al. |
| 6,922,096 B2 | 7/2005 | Cernea |
| 6,922,098 B2 * | 7/2005 | Choi et al. .................. 327/538 |
| 7,120,058 B2 | 10/2006 | Seo et al. |
| 2002/0089317 A1 | 7/2002 | Khouri et al. |
| 2006/0125451 A1 | 6/2006 | Tabaian et al. |
| 2006/0267673 A1 * | 11/2006 | Gan et al. .................. 327/540 |
| 2007/0030749 A1 * | 2/2007 | Pyeon et al. ................ 365/226 |

OTHER PUBLICATIONS

Office Action dated Mar. 1, 2007 received in related application, U.S. Appl. No. 11/295,906 (SDK1P029).

Final Rejection dated Aug. 16, 2007 received in related application, U.S. Appl. No. 11/295,906 (SDK1P029).

International Search Report dated Aug. 2, 2007 in Application No. PCT/US2007/007648 (SDK1P031WO).

* cited by examiner

VOLTAGE REGULATION WITH ACTIVE SUPPLEMENTAL CURRENT FOR OUTPUT STABILIZATION

CROSS REFERENCE TO RELATED APPLICATIONS

This application is related to U.S. patent application Ser. No. 11/303,387, entitled "CHARGE PUMP REGULATION CONTROL FOR IMPROVED POWER EFFICIENCY", and filed concurrently herewith, and which is hereby incorporated by reference herein.

BACKGROUND OF THE INVENTION

1. Field of the Invention

The invention relates to voltage generation and, more particularly, to voltage generation internal to memory systems.

2. Description of the Related Art

Memory cards are commonly used to store digital data for use with various products (e.g., electronics products). Examples of memory cards are Flash cards that use Flash type or EEPROM type memory cells to store the data. Flash cards have a relatively small form factor and have been used to store digital data for products such as cameras, hand-held computers, set-top boxes, hand-held or other small audio players/recorders (e.g., MP3 devices), and medical monitors. A major supplier of Flash cards is SanDisk Corporation of Sunnyvale, Calif.

FIG. 1 is a schematic diagram of a conventional voltage regulation circuit 100. The conventional voltage generation circuit 100 can provide a regulated voltage to a memory system that provides non-volatile data storage and represents, for example, a memory card (e.g., Flash card). The conventional voltage regulation circuit 100 includes an amplifier 102 that couples to a supply voltage (Vcc) and outputs a regulated voltage (Vdd) at output terminal 104. A resistor divider 106 is coupled to the output terminal 104. The resistor divider 106 includes resistors RI and R2. A feedback voltage (Vfb) is fed back from the resistor divider 106 to an input to the amplifier 102. Another input to the amplifier 102 is a reference voltage (Vref). The conventional voltage regulation circuit 100 also includes a decoupling capacitor 108 (Cd) coupled to the output terminal 104.

The voltage regulation circuit 100 regulates the supply voltage (Vcc) downward to produce the output voltage (Vdd). The downward regulation helps produce a more stable output voltage (Vdd) as compared to the supply voltage (Vcc). The decoupling capacitor 108 is utilized to stabilize the voltage level at the output terminal. When a load is coupled to the output terminal, the load may draw substantially high current levels (i.e., surges) such that the output voltage (Vdd) is pulled significantly downward. The decoupling capacitor 108 can operate to supply current to the output terminal 104 when significant current is being drawn by the load.

Unfortunately, however, when a load coupled to the voltage regulation circuit 100 draws substantially high current levels, the decoupling capacitor 108 needs to have a relatively large capacitance to significantly stabilize the output voltage level in the presence of current surges. However, to provide such high capacitance requires a lot of die area within a semiconductor product. Given that die area utilization affects overall size and cost of the product, there is a need to provide improved approaches to stabilizing output voltage levels in the presence of high current surges.

SUMMARY OF THE INVENTION

Broadly speaking, the invention relates to techniques for efficiently stabilizing an output voltage produced by a voltage regulation circuit. One embodiment of the invention pertains to a voltage regulation circuit that includes a supplemental current source that can be controllably activated to provide a supplemental current to an output terminal of the voltage regulation circuit. This supplemental current can then assist in stabilizing the output voltage level at the output terminal of the voltage regulation circuit even in the presence of high current surges by a load (i.e., electronic circuitry). Advantageously, given the availability of the supplemental current, the required amount of capacitance for a decoupling capacitor (also coupled to the output terminal of the voltage regulation circuit) can be significantly reduced. In the case of semiconductor electronic devices, the reduction in the needed capacitance yields substantial die area savings with respect to decoupling capacitors.

The invention can be implemented in numerous ways, including as a method, system, device or apparatus. Several embodiments of the invention are discussed below.

As a voltage regulation circuit having an input terminal for receiving a supply voltage and having an output terminal, one embodiment of the invention includes at least: an amplifier that receives a supply voltage and produces a regulated output voltage at the output terminal; a feedback circuit operatively connected to the output terminal and to a feedback terminal of the amplifier; a decoupling capacitor operatively connected to the output terminal; and a supplemental current source operatively connected to the output terminal, the supplemental current source controllably providing a supplemental current to the output terminal.

As a voltage regulation circuit having an input terminal for receiving a supply voltage and having an output terminal, one embodiment of the invention includes at least: an amplifier that receives the supply voltage and produces a regulated output voltage at the output terminal; a decoupling capacitor operatively connected to the output terminal; a resistor divider operatively connected to the output terminal to provide a divided voltage to a feedback terminal of the amplifier; a current limiter operatively connected to the supply voltage; and a transistor operatively connected to the current limiter and to the output terminal.

As a memory product, one embodiment of the invention includes at least: data storage elements; a controller for performing data storage and retrieval with respect to the data storage elements; and at least one voltage generation circuit. The voltage generation circuit including at least: an amplifier that receives a supply voltage and produces a regulated output voltage at an output terminal; a feedback circuit operatively connected to the output terminal and to a feedback terminal of the amplifier; a decoupling capacitor operatively connected to the output terminal; and a supplemental current source operatively connected to the output terminal, the supplemental current source controllably providing a supplemental current to the output terminal.

As an electronic system, one embodiment of the invention includes at least: a data acquisition device; and a data storage device removably coupled to the data acquisition unit. The data storage device stores data acquired by the data acquisition device, and the data storage device includes at least: data storage elements; a controller for performing data storage and retrieval with respect to the data storage elements; and at least one voltage generation circuit. The voltage generation circuit including at least: an amplifier that receives a supply voltage and produces a regulated output voltage at an output terminal; a feedback circuit operatively connected to the output terminal and to a feedback terminal of the amplifier; a decoupling capacitor operatively connected to the output terminal; and a supplemental current source operatively connected to the output terminal, the supplemental current source controllably providing a supplemental current to the output terminal.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to techniques for efficiently stabilizing an output voltage produced by a voltage regulation circuit. One embodiment of the invention pertains to a voltage regulation circuit that includes a supplemental current source that can be controllably activated to provide a supplemental current to an output terminal of the voltage regulation circuit. This supplemental current can then assist in stabilizing the output voltage level at the output terminal of the voltage regulation circuit even in the presence of high current surges by a load (i.e., electronic circuitry). Advantageously, given the availability of the supplemental current, the required amount of capacitance for a decoupling capacitor (also coupled to the output terminal of the voltage regulation circuit) can be significantly reduced. In the case of semiconductor electronic devices, the reduction in the needed capacitance yields substantial die area savings with respect to decoupling capacitors.

The voltage regulation circuit according to the invention is well suited for use in a semiconductor electronic product, such as a memory product. As an example, the voltage regulation circuit can be provided within a portable data storage device (e.g., memory card) to generate an internal voltage. The voltage regulation circuit according to the invention is particularly well suited for use in a Flash memory device which tends to utilize high voltages and impose substantial current surges.

Embodiments of the invention are discussed below with reference to FIGS. 2-6. However, those skilled in the art will readily appreciate that the detailed description given herein with respect to these figures is for explanatory purposes as the invention extends beyond these limited embodiments.

Figure 1:
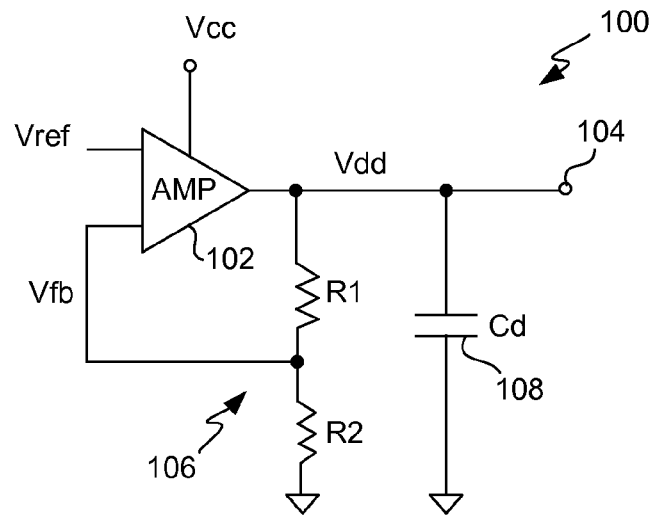
FIG. 1 is a schematic diagram of a conventional voltage regulation circuit.
Figure 2:
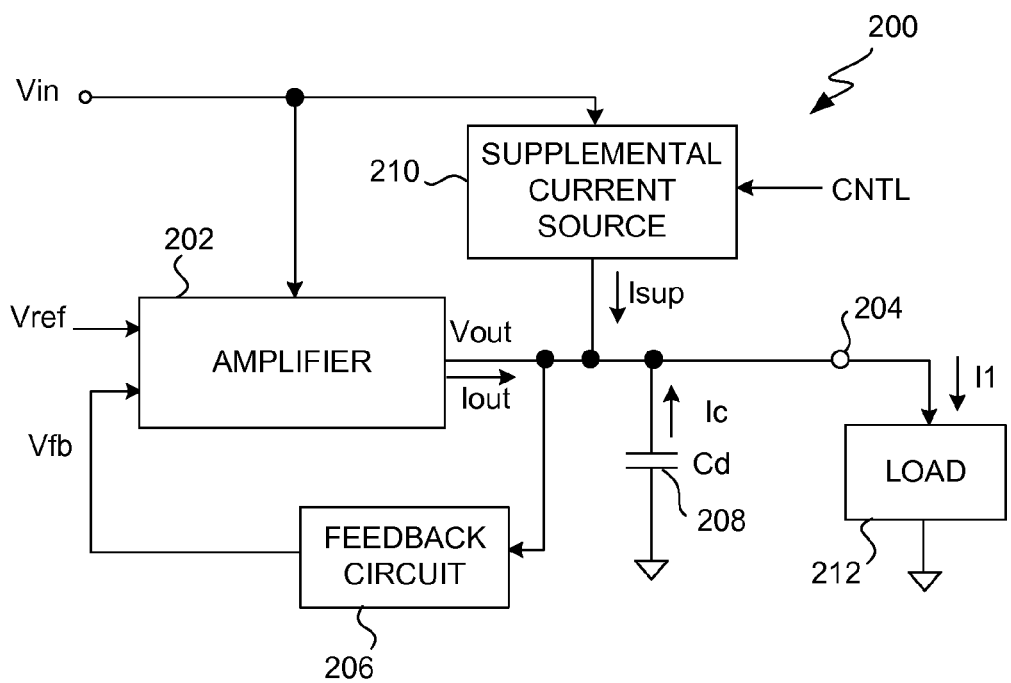
FIG. 2 is a block diagram of a voltage regulation circuit according to one embodiment of the invention.

FIG. 2 is a block diagram of a voltage regulation circuit 200 according to one embodiment of the invention. The voltage regulation circuit 200 includes an amplifier 202. The amplifier 202 is coupled to an input voltage (Vin), which serves as a supply voltage. Using the input voltage, the amplifier 202 outputs an output voltage (Vout). Typically, the output voltage is lower than the input voltage. The regulation of the voltage level downward is advantageous in that it results in lower power consumption by the electronic product (e.g., semiconductor integrated circuit) using the output voltage as an internal voltage. In addition, the downward regulation acts as a noise filter by significantly improving the noise margin. In other words, the downward regulation helps produce a more stable output voltage as compared to the input voltage. If the noise on the input voltage is significant, the regulated output voltage can still be stable so long as the regulated voltage level is below the noise range on the input voltage. For example, the input voltage may be subject to noise or otherwise be somewhat unstable such that it ranges from 2.7 to 3.6 volts, whereas the output voltage is regulated downward to 1.8 volts.

The output voltage is provided at an output terminal 204 of the voltage regulation circuit 200. A feedback circuit 206 is coupled to the output terminal 204 as well as to a first input terminal of the amplifier 202. The feedback circuit 206 monitors the output voltage at the output terminal 204 and produces a feedback voltage (Vfb) that is supplied to the first input terminal. The amplifier 202 also receives a reference voltage (Vref) that is supplied to a second input terminal of the amplifier 202. Based on the feedback voltage and the reference voltage, the amplifier 202 operates to ensure that the output voltage is held at a stable voltage level. However, the responsiveness of the feedback circuit 206 as well as the amplifier 202 are such that if a load coupled to the output terminal 204 draws a significant current surge, the output voltage can be pulled downward which renders the output voltage potentially unstable. To assist the output voltage in remaining stable even in the presence of a significant current surge, a decoupling capacitor 208 is provided. The decoupling capacitor 208 couples between the output terminal 204 and ground. The decoupling capacitor 208 can provide current to the output terminal 204 when a current surge is imposed. When the current surge is initially imposed, the amplifier 202 is not able to immediately activate its circuitry to maintain the output voltage to its desired stable level given that the responsiveness of the feedback circuit 206 and the amplifier 202 imposes a responsiveness delay time. Hence, the decoupling capacitor 208 is able to operate during the responsiveness delay time to supply current (Ic) to the output terminal 204. Additionally, so that the capacitance level of the decoupling capacitor 208 can be limited to a moderate amount, a supplemental current source 210 is provided. The supplemental current source 210 couples between the input voltage and the output terminal 204. The supplemental current source 210 operates under the control of a control signal to supply a supplemental current (Isup) to the output terminal 204. This supplemental current can be activated during the responsiveness delay time so that the supplemental current, together with the current provided by the decoupling capacitor 208, can service the current surge imposed on the output terminal 204. After the responsiveness delay time, an output current (Iout) provided by the amplifier 202 can service the current demands of the load, thereby allowing the supplemental current source to be deactivated. Typically, after the responsiveness delay time, the current from the decoupling capacitor 208 is no longer needed given the presence of the output current by the amplifier 202.

The feedback circuit 206 can be implemented in a variety of ways. In one embodiment, the feedback circuit 206 includes a resister divider coupled to the output terminal 204. In another embodiment, the feedback circuit 206 includes a capacitive divider coupled to the output terminal 204.

Figure 3:
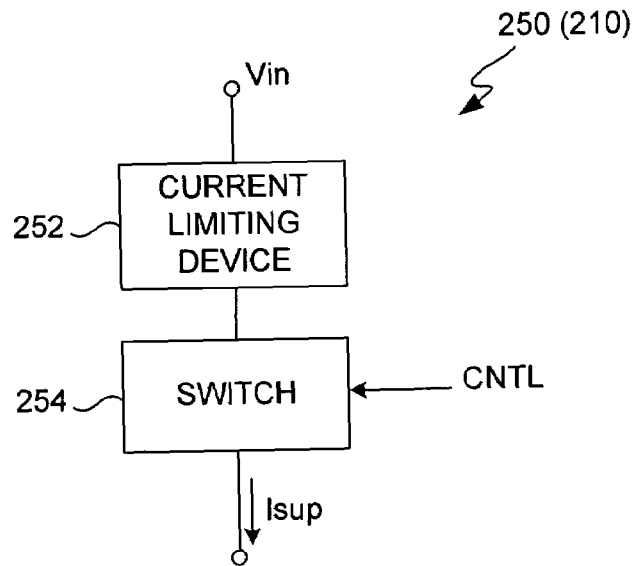
FIG. 3 is a block diagram of a supplemental current source according to one embodiment of the invention.

FIG. 3 is a block diagram of a supplemental current source 250 according to one embodiment of the invention. The supplemental current source 250 is, for example, one embodiment for the supplemental current source 210 illustrated in FIG. 2. The supplemental current source 250 includes a current limiting device 252 connected in series with a switch 254. The switch 254 is controlled by a control signal (CNTL). The current limiting device 252 couples to an input voltage (Vin). The output of the switch 254, when the switch is activated by the control signal (CNTL), is a supplemental current (Isup). The current limiting device 252 operates to limit the amount of current that can be drawn from the input voltage. By limiting the current, the supplemental current (Isup) being produced can be controlled such that a maximum amount of supplemental current is known and the input voltage (i.e., supply voltage) is protected from being overwhelmed. In one embodiment, the current limiting device 252 can include at least one a resistor. In another embodiment, the current limiting device 252 can be a reference current, such as a current produced by a current mirror circuit. In still another embodiment, the current limiting device 252 can be a transistor to clamp the input voltage to the switch 254.

Figure 4:
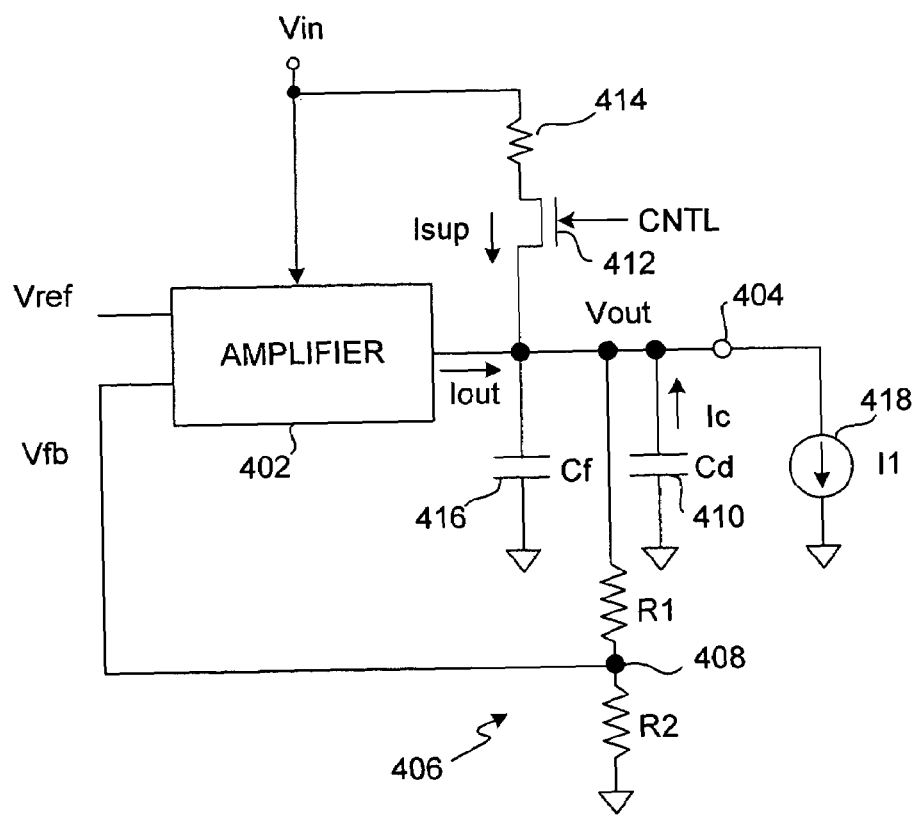
FIG. 4 is a schematic diagram of a voltage regulation circuit according to another embodiment of the invention.

FIG. 4 is a schematic diagram of a voltage regulation circuit 400 according to another embodiment of the invention. The voltage regulation circuit 400 can represent one embodiment of the voltage regulation circuit 200 illustrated in FIG. 2. The voltage regulation circuit 400 includes an amplifier 402. The amplifier 402 couples to an input voltage (Vin) and outputs an output voltage (Vout). The output voltage is typically regulated downward from the input voltage. The output voltage is output at an output terminal 404 of the voltage regulation circuit 400. A resistor divider 406 is coupled to the output terminal 404. The resistor divider includes resistors R1 and R2 connected in series between the output terminal 404 and ground. At a node 408 between the resistors R1 and R2, a feedback voltage (Vfb) is acquired and fed back to a first input terminal of the amplifier 402. A reference voltage (Vref) is supplied to a second input terminal of the amplifier 402. The voltage regulation circuit 400 also includes a decoupling capacitor (Cd) 410 coupled between the output terminal 404 and ground. Still further, the voltage regulation circuit 400 includes a transistor 412 and a resistor 414 connected in series between the input voltage and the output terminal 404. The transistor 412 is controlled by a control signal (CNTL). A filter capacitor 416 can also be coupled between the output terminal 404 and ground.

When a load is connected to the output terminal 404 of the voltage regulation circuit 400, the load can utilize the output voltage in operating the electrical circuitry associated with the load. Namely, the load can, at certain times, impose a load current (Il) 418 on the voltage regulation circuit 400. In many electronic circuits, the load current (Il) 418 is significant and rapidly imposed. As a result, the amplifier 402 is not able to react instantaneously to supply the load current that is being drawn from the output terminal 404. That is, the responsiveness of the amplifier 402 to a current load on the output terminal 404 is delayed. This delay can be referred to as an amplifier response delay time. However, to prevent the output voltage from dipping substantially downward during the amplifier response delay time, the voltage regulation circuit 400 utilizes the decoupling capacitor 410 as well as the series combination of the transistor 412 and the resistor 414. More particularly, the decoupling capacitor 410 can supply a current (Ic) to the output terminal 404. In addition, the combination of the transistor 412 and the resistor 414, if activated by the control signal (CNTL), can produce a supplemental current (Isup) that is supplied to the output terminal 404.

Although FIG. 4 illustrates only a single transistor 412 and resistor 414 to produce a supplemental current (Isup), it should be understood that the transistor 412 and resistor 414 combination can be replicated to provide a plurality of independently controlled supplemental currents that can be provided to an output terminal. For example, each supplemental current might provide a fixed amount of current to the output terminal. If the current load requires more than one of such supplemental currents, additional independent supplemental currents can be activated as is required. For example, if the current drawn by a load is 10 milliamps, and the decoupling capacitor provides 4 milliamps of current, then 6 milliamps should be provided by the supplemental current. If each resistor and transistor combination produces 1 milliamp of supplemental current, then six (6) resistor and transistor combinations are needed to yield the 6 milliamps of supplemental current.

Electronic circuits typically are associated with particular functions. In many cases, the operation of these electronic circuits have predetermined modes or operations. In one embodiment, the operation of these electronic circuits is controlled by a state machine. In other words, when an operation is being performed, it is understood what the operation does and for how long. Hence, the overall operation of the electronic circuit can be characterized with respect to its current draw needs. For example, in a memory electronic circuit, its various operations such as program, erase, and read can can be controlled by a state machine for which the power magatitude and timing are known. As such, with respect to a voltage regulation circuit, a control signal can be determined so that an additional supplemental current can be activated when the electronic circuit requires additional current (e.g., when current surge occurs before the amplifier can respond). Additionally, a decoupling capacitor no longer need be solely (or substantially solely) responsible to supply the current load when the electronic circuit requires additional current (e.g., when current surge occurs before the amplifier can respond). Consequently, the decoupling capacitor can be made smaller than conventional designs would permit, thereby yielding a substantial savings in die area.

Figure 5:
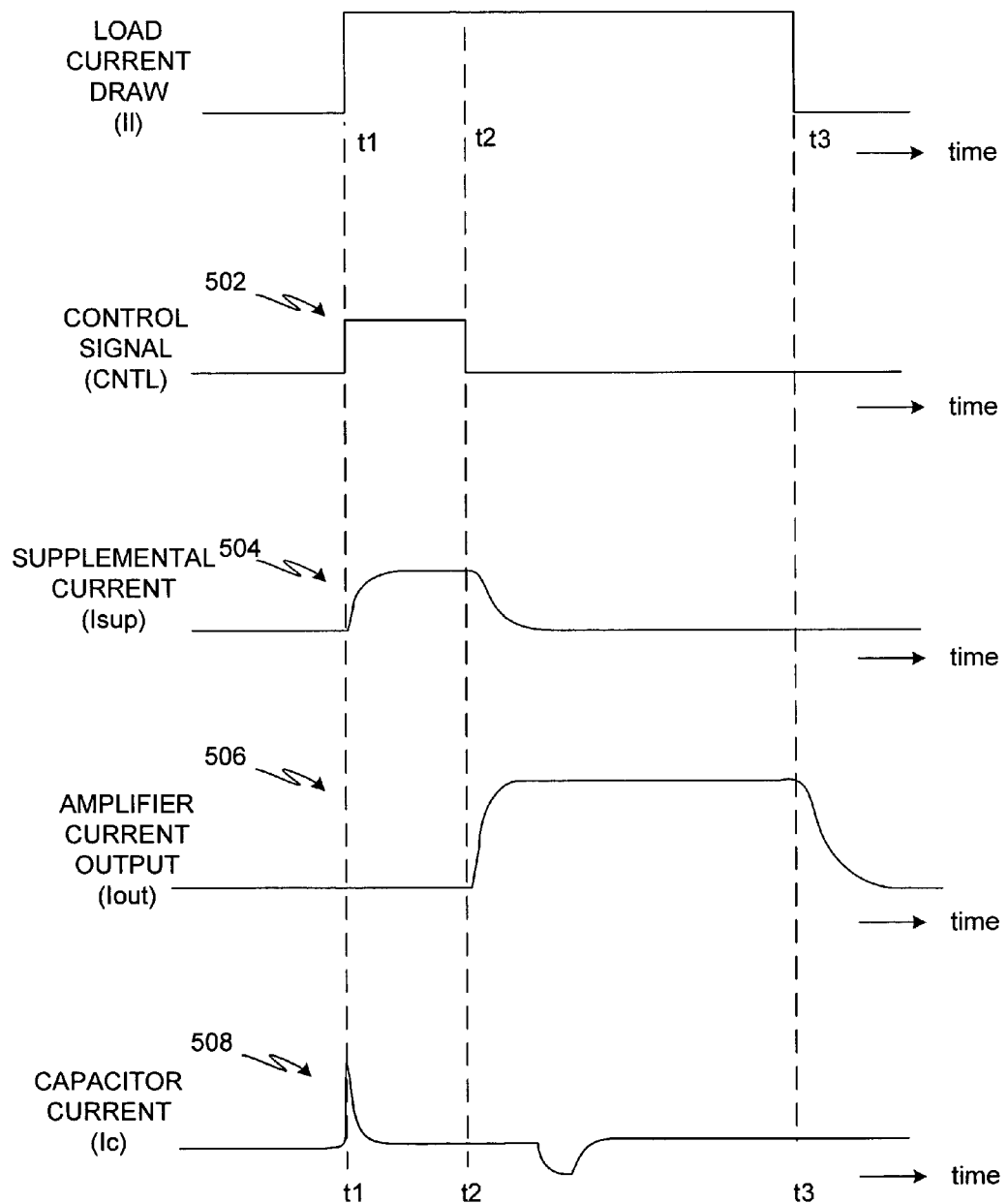
FIG. 5 illustrates various representative signal waveforms regarding a voltage regulation circuit according to one embodiment of the invention.

FIG. 5 illustrates various representative signal waveforms 500-508 regarding a voltage regulation circuit according to one embodiment of the invention. These signal waveforms 500-508 can be associated with the voltage generation circuits illustrated in FIGS. 2 and 4. The waveform 500 depicts load current Il being drawn versus time. The waveform 500 indicates that the load current Il is imposed at time t1 until time t3. The waveform 502 illustrates a control signal (CNTL) versus time. As illustrated in FIG. 5, the control signal is active from the time period t1 to t2. The waveform 504 depicts a supplemental current (Isup) versus time. The waveform 504 indicates that the supplemental current is being supplied to an output terminal of the voltage regulation circuit during the time period between t1 and t2.

The waveform 506 depicts amplifier current output (Iout) versus time. The time from t1 to t2 with respect to the waveform 506 indicates that the amplifier current output is not stabilized until time t2. In other words, the responsiveness of the amplifier is delayed during the time period from t1 to t2 (i.e., amplifier response delay time). The waveform 508 illustrates a capacitor current (Ic) that is supplied by a decoupling capacitor versus time. The current from the decoupling capacitor is typically only required during the time period from t1 to t2. After time t2, the capacitor current (Ic) as well as the supplemental current (Isup) are typically not needed when the amplifier current output is fully engaged. That is, the load current (Il) being drawn from the output terminal of the voltage regulation circuit is primarily (or exclusively) supplied by the decoupling capicitor and the supplemental current source during the time period from t1 and t2, but from t2 to t3 the load current is primarily (or exclusively) supplied by the amplifier current output (Iout). After time t2, the amplifier current output (Iout) can also be used to recharge the decoupling capacitor, in such case the current from the decoupling capacitor can go negative for a period of time as shown in the waveform 508. In another embodiment, the supplemental current and/or the current from the decoupling capacitor can be gradually decreased in the vicinity of t2 so the transition to the amplifier current output (Iout) is stable.

Figure 6:
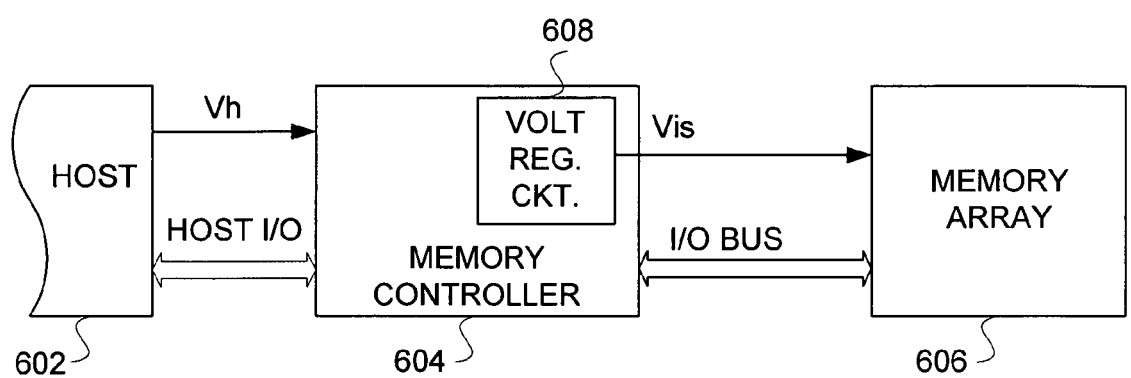
FIG. 6 is a block diagram of a memory system according to one embodiment of the invention.

FIG. 6 is a block diagram of a memory system 600 according to one embodiment of the invention. The memory system 600 is, for example, associated with a memory card (such as a plug-in card), a memory stick, or some other data storage product. Examples of a memory card include PC Card (formerly PCMCIA device), Flash Card, Flash Disk, Multimedia Card, and ATA Card. The memory system 600 can also be referred to as a memory product or a removable data storage product.

The memory system 600 cooperates with a host 602. For example, the host 602 can be a computing device, such as a personal computer. In particular, the memory system 600 stores data that can be utilized by the host 602. The memory system 600 and the host 602 can communicate over a host Input/Output (I/O) bus. The host 602 provides a host voltage (Vh) (i.e., supply voltage) to the memory system 600. The memory controller 604 couples to the host I/O bus and the host voltage (Vh). The memory controller 604 couples to a memory array 606 using an I/O bus and an internal supply voltage (Vis). The internal supply voltage (Vis) is produced by a voltage regulation circuit 608 provided within the memory controller 604. The voltage regulation circuit 608 can correspond to any of the voltage generation circuits discussed herein. For example, the voltage regulation circuit 608 can correspond to the voltage regulation circuits illustrated in FIG. 2 or 4.

The level of the voltages can vary with implementation as one example, the host voltage (Vh) might be 3.3 or 1.8 volts. Moreover, although the voltage regulation circuit 608 is illustrated in FIG. 6 as being internal to the memory controller 604, in alternative embodiment, the voltage regulation circuit 608 can be (i) internal to the memory array 606 or (ii) separate from either the memory controller 604 or the memory array 606.

The memory array 606 provides an array of data storage elements that provide non-volatile digital data storage. In one embodiment, the data storage elements are electrically programmable and electrically erasable, such as EEPROM or Flash devices. For example, the data storage elements can be based on floating-gate devices. The memory array 606 can include one or more semiconductor dies, chips or products. The memory array 606 can include data storage elements. The memory controller 604 is also often a separate semiconductor die, chip or product.

Although the embodiment of the memory system 600 shown in FIG. 6 produces the internal supply voltage (Vis) at the memory controller 604, it should be understood that the memory controller 604 can produce any number of a plurality of different supply voltage levels that would be needed by the memory array 606.

The invention is suitable for use with both single-level memories and multi-level memories. The memories or memory blocks are data storage devices that include data storage elements. The data storage elements can be based on semiconductor devices (e.g., floating-gate) or other types of devices. In multi-level memories, each data storage element stores two or more bits of data.

The invention can further pertain to an electronic system that includes a memory system as discussed above. Memory systems (i.e., memory cards) are commonly used to store digital data for use with various electronics products. The memory system is often removable from the electronic system so the stored digital data is portable. The memory systems according to the invention can have a relatively small form factor and be used to store digital data for electronics products that acquire data, such as cameras, hand-held or notebook computers, network cards, network appliances, set-top boxes, hand-held or other small media (e.g., audio) players/recorders (e.g., MP3 devices), and medical monitors.

The advantages of the invention are numerous. Different embodiments or implementations may yield one or more of the following advantages. One advantage of the invention is that voltage regulation for electronic products (e.g., semiconductor electronic products) can be provided in a stable and compact manner. Another advantage of the invention is that low power, reliable, high performance memory systems can be obtained.

The many features and advantages of the invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A voltage regulation circuit having an input terminal for receiving a supply voltage and having an output terminal, comprising:

an amplifier that receives the supply voltage and produces a regulated output voltage at the output terminal wherein said amplifier responds to a change to the regulated output voltage only after an amplifier response delay time;

a feedback circuit operatively connected to the output terminal and to a feedback terminal of said amplifier;

a decoupling capacitor operatively connected to the output terminal arranged to provide a decoupling capacitor current to the output terminal only during the amplifier response delay time; and a supplemental current source operatively connected to the output terminal, said supplemental current source controllably providing a supplemental current to the output terminal in co-operation with the decoupling capacitor providing the decoupling capacitor current only during the amplifier response delay time thereby stabilizing the regulated output voltage by substantially eliminating a downward going voltage transition at the output terminal during the amplifier response delay time.

2. A voltage regulation circuit as recited in claim 1, wherein said supplemental current source is connected to the supply voltage.

3. A voltage regulation circuit as recited in claim 1, wherein said supplemental current source is controlled by a supplemental current source control signal.

4. A voltage regulation circuit as recited in claim 3, wherein said supplemental current source includes at least:
   a current limiting device; and
   a switch,
   wherein said current limiting device and said switch are connected in series between the supply voltage and the output terminal.

5. A voltage regulation circuit as recited in claim 4, wherein said switch has a switching operation that operates under the control of the supplemental current source control signal.

6. A voltage regulation circuit as recited in claim 5, wherein the switching operation of said switch either permits the supplemental current to reach the output terminal or blocks the supplemental current from reaching the output terminal.

7. A voltage regulation circuit as recited in claim 3, wherein said supplemental current source includes at least:
   a first current limiting device and a first switch, where said first current limiting device and said first switch are connected in series between the supply voltage and the output terminal; and
   a second current limiting device and a second switch, where said second current limiting device and said second switch are connected in series between the supply voltage and the output terminal.

8. A voltage regulation circuit as recited in claim 7, wherein said first switch has a switching operation that operates under the control of a first signal of the control signal, and wherein said second switch has a switching operation that operates under the control of a second signal of the control signal.

9. A voltage regulation circuit as recited in claim 1, wherein the regulated output voltage is lower than the supply voltage.

10. A voltage regulation circuit as recited in claim 1, wherein said voltage regulation circuit is provided within a memory system, and wherein said supplemental current source is controlled to provide the supplemental current to the output terminal during an initial portion of at least one operation of the memory system.

11. A voltage regulation circuit as recited in claim 10, wherein said decoupling capacitor stores a charge that is used to provide the decoupling capacitor current to the output terminal during at least the initial portion of the at least one operation of the memory system.

12. A voltage regulation circuit as recited in claim 1, wherein said feedback circuit includes at least a capacitive divider.

13. A voltage regulation circuit having an input terminal for receiving a supply voltage and having an output terminal, comprising:
   an amplifier that receives the supply voltage and produces a regulated output voltage at the output terminal wherein said amplifier responds to a change to the regulated output voltage only after an amplifier response delay time;
   a decoupling capacitor operatively connected to the output terminal arranged to provide a decoupling capacitor current to the output terminal only during the amplifier response delay time;
   a resistor divider operatively connected to the output terminal to provide a divided voltage to a feedback terminal of said amplifier;
   a current limiter operatively connected to the supply voltage; and
   a transistor operatively connected to said current limiter and to the output terminal wherein the current limiter and the transistor controllably providing a supplemental current to the output terminal in co-operation with the decoupling capacitor providing the decoupling capacitor current only during the amplifier response delay time thereby stabilizing the regulated output voltage by substantially eliminating a downward going voltage transition at the output terminal during the amplifier response delay time.

14. A voltage regulation circuit as recited in claim 13, wherein said transistor has a gate terminal, a first channel terminal and a second channel terminal, the gate terminal receiving a control signal, the first channel terminal being operatively connected to said current limiter, and the second channel terminal being operatively connected to the output terminal.

15. A voltage regulation circuit as recited in claim 14, wherein when a load connected to the output terminal induces a current draw, current to satisfy the current draw is provided, at least during an initial period, by at least said transistor and said current limiter.

16. A voltage regulation circuit as recited in claim 14, wherein when a load connected to the output terminal induces a current draw, current to satisfy the current draw is provided, at least during an initial period, by at least said decoupling capacitor as well as said transistor and said current limiter.

17. A voltage regulation circuit as recited in claim 16, wherein, subsequent to the initial period, (i) the control signal disables said transistor from providing the supplemental current to the output terminal, and (ii) said amplifier outputs current to the output terminal.

18. A voltage regulation circuit as recited in claim 13, wherein said voltage regulation circuit further comprises:
   a filter capacitor operatively connected to the output terminal.

19. A voltage regulation circuit as recited in claim 13, wherein said current limiter is a resistor.

20. A memory product, comprising:
   data storage elements;
   a controller for performing data storage and retrieval with respect to the data storage elements; and
   at least one voltage generation circuit coupled to the controller, the voltage generation circuit comprising:
   an amplifier that receives a supply voltage and produces a regulated output voltage at an output terminal wherein said amplifier responds to a change to the regulated output voltage only after an amplifier response delay time;
   a feedback circuit operatively connected to the output terminal and to a feedback terminal of said amplifier;
   a decoupling capacitor operatively connected to the output terminal arranged to provide a decoupling capacitor current to the output terminal only during the amplifier response delay time; and
   a supplemental current source operatively connected to the output terminal, said supplemental current source controllably providing a supplemental current to the output terminal in co-operation with the decoupling capacitor providing the decoupling capacitor current only during the amplifier response delay time thereby stabilizing the regulated output voltage by substantially eliminating a downward going voltage transition at the output terminal during the amplifier response delay time.

21. A memory product as recited in claim 20, wherein the memory product is a memory card.

22. A memory product as recited in claim 20, wherein the data storage elements provide non-volatile data storage.

23. A memory product as recited in claim 20, wherein the data storage elements provide semiconductor-based data storage.

24. A memory product as recited in claim 23, wherein the data storage elements are EEPROM or Flash.

25. A memory product as recited in claim 20, wherein each of the data storage elements comprise at least one floating-gate storage device.

26. A memory product as recited in claim 20, wherein the memory product is a removable data storage product.

27. A memory product as recited in claim 20, wherein the memory product is removably coupled to a host.

28. A memory product as recited in claim 27, wherein the host is a computing device.

29. An electronic system, comprising:
a data acquisition device; and
a data storage device removably coupled to the data acquisition unit, the data storage device storing data acquired by the data acquisition device, and the data storage device including at least:
data storage elements;
a controller for performing data storage and retrieval with respect to the data storage elements; and
at least one voltage generation circuit coupled to the controller, the voltage generation circuit including at least:
an amplifier that receives a supply voltage and produces a regulated output voltage at an output terminal wherein said amplifier responds to a change to the regulated output voltage only after an amplifier response delay time;
a feedback circuit operatively connected to the output terminal and to a feedback terminal of said amplifier;
a decoupling capacitor operatively connected to the output terminal arranged to provide a decoupling capacitor current to the output terminal only during the amplifier response delay time; and
a supplemental current source operatively connected to the output terminal, said supplemental current source controllably providing a supplemental current to the output terminal in co-operation with the decoupling capacitor providing the decoupling capacitor current only during the amplifier response delay time thereby stabilizing the regulated output voltage by substantially eliminating a downward going voltage transition at the output terminal during the amplifier response delay time.

30. An electronic system as recited in claim 29, wherein the data acquisition device is one of a camera, a network card or appliance, a hand-held or notebook computer, a set-top box, a hand-held or other small media player/recorder, and a medical monitor.

* * * * *